US 6,466,837 B1

(12) United States Patent
Mimura et al.

(10) Patent No.: US 6,466,837 B1
(45) Date of Patent: Oct. 15, 2002

(54) PARTS INSTALLATION METHOD AND PARTS MOUNTING METHOD AND MOUNTER

(75) Inventors: Yoshihiro Mimura, Izumi; Noriaki Yoshida, Ikeda; Akira Kabeshita, Hirakata, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/308,889

(22) PCT Filed: Dec. 1, 1997

(86) PCT No.: PCT/JP97/04379

§ 371 (c)(1),
(2), (4) Date: Jul. 8, 1999

(87) PCT Pub. No.: WO98/24292

PCT Pub. Date: Jun. 4, 1998

(30) Foreign Application Priority Data

Nov. 29, 1996 (JP) .............................. 8-319985

(51) Int. Cl.[7] ........................... G06F 7/00; G06F 19/00; B23P 19/00; B65G 1/133
(52) U.S. Cl. ....................... 700/121; 700/179; 700/220; 414/749.1; 414/752.1; 29/740
(58) Field of Search ................. 700/121, 179, 700/220, 259; 414/752.1, 749.1, 749.3; 29/740, 743

(56) References Cited

U.S. PATENT DOCUMENTS

| 4,624,050 A | 11/1986 | Hawkswell ................... 29/740 |
| 4,770,599 A | 9/1988 | Hawkswell .................. 414/752 |
| 4,831,721 A | 5/1989 | Hirai et al. .................... 29/740 |
| 4,917,568 A | * 4/1990 | Hawkswell .................. 414/737 |
| 5,667,129 A | * 9/1997 | Morita et al. ................ 228/102 |
| 5,688,214 A | * 11/1997 | Mase et al. ..................... 483/1 |
| 6,088,911 A | * 7/2000 | Isogai et al. .................. 29/740 |
| 6,154,954 A | * 12/2000 | Seto et al. ..................... 29/740 |

FOREIGN PATENT DOCUMENTS

EP     0 552 922     7/1993

* cited by examiner

Primary Examiner—Maria N. Von Buhr
Assistant Examiner—Elliot Frank
(74) Attorney, Agent, or Firm—Parkhurst & Wendel, LLP

(57) ABSTRACT

A parts mounter including a unit for supplying a part, circuit board supporting means for fastening a circuit board when mounting a part, parts mounting means including a mechanism loaded with a suction nozzle and for vertically moving the suction nozzle when sucking and holding a part, and for positioning the suction nozzle at any position, and nozzle exchanging means including a mechanism for removing and installing a requested suction nozzle from and to the parts mounting means. The parts mounting means further includes a nozzle existence checking sensor for performing detection of conditions of a suction nozzle loaded to the parts mounting means.

10 Claims, 11 Drawing Sheets

FIG. 6

MOUNTING DATA

| MOUNTING ORDER | INSTALLATION POSITION ON CIRCUIT BOARD | | INSTALLATION ANGLE $\theta$ | PARTS SUPPLY POSITION IN PARTS SUPPLY MEANS | USED HEAD |
|---|---|---|---|---|---|
| | X | Y | | | |
| 1 | $X_1$ | $Y_1$ | $\theta_1$ | $9a-Z_i$ | $H_i$ |
| 2 | $X_2$ | $Y_2$ | $\theta_2$ | $9a-Z_j$ | $H_j$ |
| 3 | $X_3$ | $Y_3$ | $\theta_3$ | $9b-Z_k$ | $H_k$ |
| ⋮ | ⋮ | ⋮ | ⋮ | ⋮ | ⋮ |

FIG. 7

PARTS SUPPLY SECTION DATA

| PARTS SUPPLY POSITION | PARTS NAME | | USED NOZZLE | VACUUM VALUE |
|---|---|---|---|---|
| $9a-Z_1$ | Parts A | ... | $N_1$ | $P_1$ |
| $9a-Z_2$ | Parts B | ... | $N_m$ | $P_m$ |
| ⋮ | ⋮ | ⋮ | ⋮ | ⋮ |
| $9b-Z_1$ | Parts C | ... | $N_n$ | $P_n$ |
| $9b-Z_2$ | Parts D | ... | $N_o$ | $P_{o+1}$ |
| ⋮ | ⋮ | ⋮ | ⋮ | ⋮ |

FIG. 8

NOZZLE DATA

| USED NOZZLE | NOZZLE INSTALLATION POSITION IN NOZZLE EXCHANGING MEANS |
|---|---|
| $N_1$ | $ST_1$ |
| $N_2$ | $ST_2$ |
| $N_3$ | $ST_3$ |
| ⋮ | ⋮ |

PARTS INSTALLATION METHOD AND PARTS MOUNTING METHOD AND MOUNTER

TECHNICAL FIELD

The present invention relates to a parts installation method and a parts mounting method and a mounter for automatically mounting parts such as electronic parts, optical parts, or mechanism elements onto a circuit board.

BACKGROUND ART

FIG. 11 is an overall rough drawing showing the general configuration of a conventional electronic parts mounter, and FIG. 12 is a partial detail drawing. In the electronic parts mounter of FIG. 11, two pieces of suction nozzles 2 are loaded to electronic parts mounting means 1, but any pieces of suction nozzles 2 can be loaded by changing the mechanism. Accordingly, the description will be given below as for an electronic parts mounter equipped with the electronic parts mounting means 1 to which any pieces of suction nozzles 2 can be loaded.

Then, the number of pieces of suction nozzles 2 which can be loaded to the electronic parts mounting means 1 is limited, and furthermore, depending on the kind of an electronic part, the suction nozzle 2 which can suck and hold the part is also limited. Therefore, in the case where a necessary suction nozzle 2 is not loaded to the electronic parts mounting means 1 when mounting a requested electronic part, nozzle exchange is needed. In some cases, the nozzle exchange arises in the middle of production of one piece of circuit board 3, or in some cases, it also arises while the kind of circuit board 3 to be produced is changing.

While taking into account the above facts, by referring to a conventional control sequence in FIG. 10 and FIGS. 11, 12, a conventional electronic parts mounting method using an electronic parts mounter for mounting electronic parts on a circuit board will be described.

First, a circuit board 3 to be produced is carried into circuit board supporting means 5 from a board carrying section 4 (step #1). At this moment, if an electronic part in the last production remains at the tip of the suction nozzle 2 because of any obstacle such as inoperativeness of blowing function of a nozzle during parts mounting, there is a risk of breaking the circuit board 3 to be produced here or an electronic parts mounter main body when going to take the next part or when mounting it. The conventional mounter had no means to check a part sucked and held by the suction nozzle 2. Accordingly, in the conventional mounter, when carrying in this circuit board 3, it was necessary to shift the electronic parts mounting means 1 to a position of a parts disposal box 6 (step #2) and to perform parts disposal operation (step #5).

Moreover, at the same time, in order to check whether any requested suction nozzle 2 is loaded to the electronic parts mounting means 1 or not, the present nozzle charge condition is detected by a nozzle existence checking sensor 7 installed at a parts disposal box 6 (step #6). This detecting operation is performed as follows: First, collars 2a of all suction nozzles 2 are raised up to a sensing position where an optical path of the nozzle existence checking sensor is not interrupted. Next, whether the collar 2a interrupts the optical path of a nozzle existence checking sensor 7 or not is detected by vertically moving suction nozzles 2 one by one in turn by approximately 2 mm. That is, when the suction nozzle 2 is properly loaded, it interrupts the optical path of the nozzle existence checking sensor 7, but when no suction nozzle 2 is loaded, the collar 2a does not interrupt the optical path thereof, and consequently, the condition can be detected. However, the nozzle existence checking sensor 7 can check only existence of charge of the nozzle 2, but it cannot check the kind of the nozzle or the nozzle charge condition. Checking of the kind of a nozzle 2 is performed in such a way that a control section (not shown in the figure) deduces what kind of nozzle 2 is loaded to the electronic parts mounting means 1 from the mounting data or the nozzle data stored in a memory.

Here, if nozzle exchange is necessary for producing a carried-in circuit board (step #9), the electronic parts mounting means 1 is shifted onto nozzle exchanging means 8 by an XY robot 12 in order to load the necessary suction nozzle 2 to the electronic parts mounting means 1. Then, when an unsuitable suction nozzle 2 is in place, the unsuitable suction nozzle 2 is removed from the electronic parts mounting means, and the desired suction nozzle 2 required for the production is loaded (step #10).

After that, according to the previously prepared mounting data, the electronic parts mounting means 1 is shifted on parts supply means 9 (9a or 9b), and a requested suction nozzle 2 is located at a parts supply position to suck and hold the requested electronic part (step #11).

Next, the electronic parts mounting means 1 is shifted so that the sucked and held electronic part may be located on a parts recognizing device 10, and the attitude of the electronic part sucked and held by the suction nozzle 2 is imaged by the parts recognizing device 10. On the basis of this imaged result, the mounting position of the electronic part is compensated (step #12).

Next, the electronic parts mounting means 1 is located so that the electronic part may be positioned at the mounting position on a circuit board 3, and the electronic part is mounted on the circuit board 3 (step #13).

By repeating such a series of suction operations according to the previously prepared mounting data, one piece of circuit board is produced. At this moment, whether the production of the circuit board 3 has finished or not is checked (step #14). When the production has finished, the circuit board 3 is carried out of the circuit board supporting means 5 to the board carrying section 4 (step #19).

When the production has not finished, suction processing of the next electronic part is performed (steps #15 to #18, #11 to #13). At this moment, whether the suction nozzle 2 required for the mounting of the next electronic part is loaded to the electronic parts mounting means 1 or not is checked (step #15). When such a suction nozzle 2 is not loaded, nozzle exchange is performed by the nozzle exchanging means 8 after checking the existence of the nozzle on the parts disposal box 6 following the same procedure as when carrying in a board (steps #16 to #18).

However, in the conventional electronic parts mounting method, when carrying in and carrying out a circuit board, the electronic parts mounting means 1 shifts to the parts disposal box 6 to check the existence of a nozzle. However, if the carriage of the board 3 is speeded up for improving productivity, the board carrying time is decreased, and therefore, the nozzle existence checking cannot be finished within the time of carrying the board. Therefore, in some cases, the means for other productions must be stopped only for the nozzle existence checking, and a problem of occurrence of wasteful production stopping time arises.

Moreover, in the case where it is attempted to improve productivity by reducing the number of times of nozzle exchange, the number of pieces of suction nozzles 2 capable of being loaded to the electronic parts mounting means 1 is increased as a result. In this case, the number of pieces of suction nozzles 2 which requires nozzle existence checking is increased, and the time required for that is increased as a result. Accordingly, similarly as the above description, wasteful production stopping time arises, since nozzle existence checking is performed although the carriage of a board has already finished.

Furthermore, even when any disposal of parts is not required but only nozzle exchange is required, the electronic parts mounting means 1 always shifts to the parts disposal box 6, and after performing nozzle existence checking at that position, it further shifts to the nozzle exchanging means 8. Therefore, the conventional nozzle exchange has a disadvantage of accompanying wasteful operation.

DISCLOSURE OF THE INVENTION

Accordingly, due to the above conventional problems, it is an object of the present invention to provide an efficient electronic parts mounting method and an electronic parts mounter to avoid wasteful operation and time by installing a nozzle existence checking sensor onto electronic parts mounting means so as to perform existence checking of a suction nozzle while shifting the electronic parts mounting means.

In order to attain the above object, the parts mounting method of the present invention is a parts installation method to install a part held by a holding member to a body to be equipped while exchanging the holding member with a replacement holding member prepared in a tool change section corresponding to the part to be held, wherein it is judged while shifting said holding member whether it is right or wrong to exchange said holding member with said replacement holding member. corresponding to the part to be held, wherein it is judged in the middle of shifting said holding member whether it is right or wrong to exchange said holding member with said replacement holding member.

Moreover, the parts mounting method of the present invention is a parts installation method for installing a part held by a suction nozzle to a body to be equipped while exchanging the suction nozzle with a replacement suction nozzle prepared in a nozzle exchanging means corresponding to the part to be sucked and held, wherein the part is sucked and held by a movable suction nozzle of said suction nozzle and is mounted to a body to be equipped, and wherein in the middle of shifting the parts mounting means equipped with a nozzle existence checking sensor, it is performed by the nozzle existence checking sensor to detect the existence of a suction nozzle among one piece of or a plurality of suction nozzles loaded to said parts mounting means.

Moreover, the parts mounting method of the present invention is a parts mounting method to suck and hold a part by a suction nozzle and to mount the part to a body to be equipped, which comprises a first step of positioning a requested suction nozzle among one piece of or a plurality of suction nozzles loaded to said parts mounting means at a sensing position of said nozzle existence checking sensor in the middle of shifting of the parts mounting means equipped with the nozzle existence checking sensor, a second step of performing the detection of existence of the suction nozzle positioned at the sensing position by said nozzle existence checking sensor, and a third step of performing said first step and second step for a plurality of loaded specified suction nozzles in turn.

Moreover, the parts installation device of the present invention comprises an installation head which includes a holding member capable of being freely attached and detached so as to be exchangeable corresponding to a part to be held, thereby to install the part held by said holding member to a body to be equipped, and a tool change section which includes a replacement holding member capable of being attached to said installation head and in which said holding member is exchanged with said replacement holding member by said installation head, wherein said installation head includes a member detector for detecting existence of the replacement holding member in said tool change section.

Moreover, the parts installation device of the present invention comprises parts supply means including a unit for supplying a part, circuit board supporting means for fastening a circuit board when mounting a part, parts mounting means including a mechanism which is loaded with a suction nozzle and adapted to vertically move said suction nozzle when sucking and holding a part and positions the suction nozzle at any position, and nozzle exchanging means including a mechanism which removes and installs a requested suction nozzle from and to said parts mounting means, wherein said parts mounting means is equipped with a nozzle existence checking sensor for detecting conditions of the suction nozzle loaded to said parts mounting means.

In the electronic parts mounting method and the mounter described in the prior art, the nozzle existence checking is performed in a state of stopping on a parts disposal box, and therefore, wasteful production stopping time arises, so that production efficiency may be lowered.

According to the electronic parts mounting method and the mounter of the present invention, the nozzle existence checking sensor is installed at the electronic parts mounting means loaded with a suction nozzle, and therefore, it is possible to check the existence of the nozzle in the middle of shifting the electronic parts mounting means for performing any processing such as parts disposal operation or nozzle exchange, so that wasteful production stopping time can be eliminated.

BRIEF DESCRIPTION OF THE DRAWINGS

FIG. 6 is an explanation drawing of the mounting data stored in a memory in one example of the present invention;

FIG. 7 is an explanation drawing of the parts supply section data stored in a memory in one example of the present invention;

FIG. 8 is an explanation drawing of the nozzle data stored in a memory in one example of the present invention;

DESCRIPTION OF THE EMBODIMENTS

One example of the present invention will be described below in detail by referring to drawings.

The following example shows a mounting method for mounting electronic parts to a circuit board as an installation mode.

Figure 1:
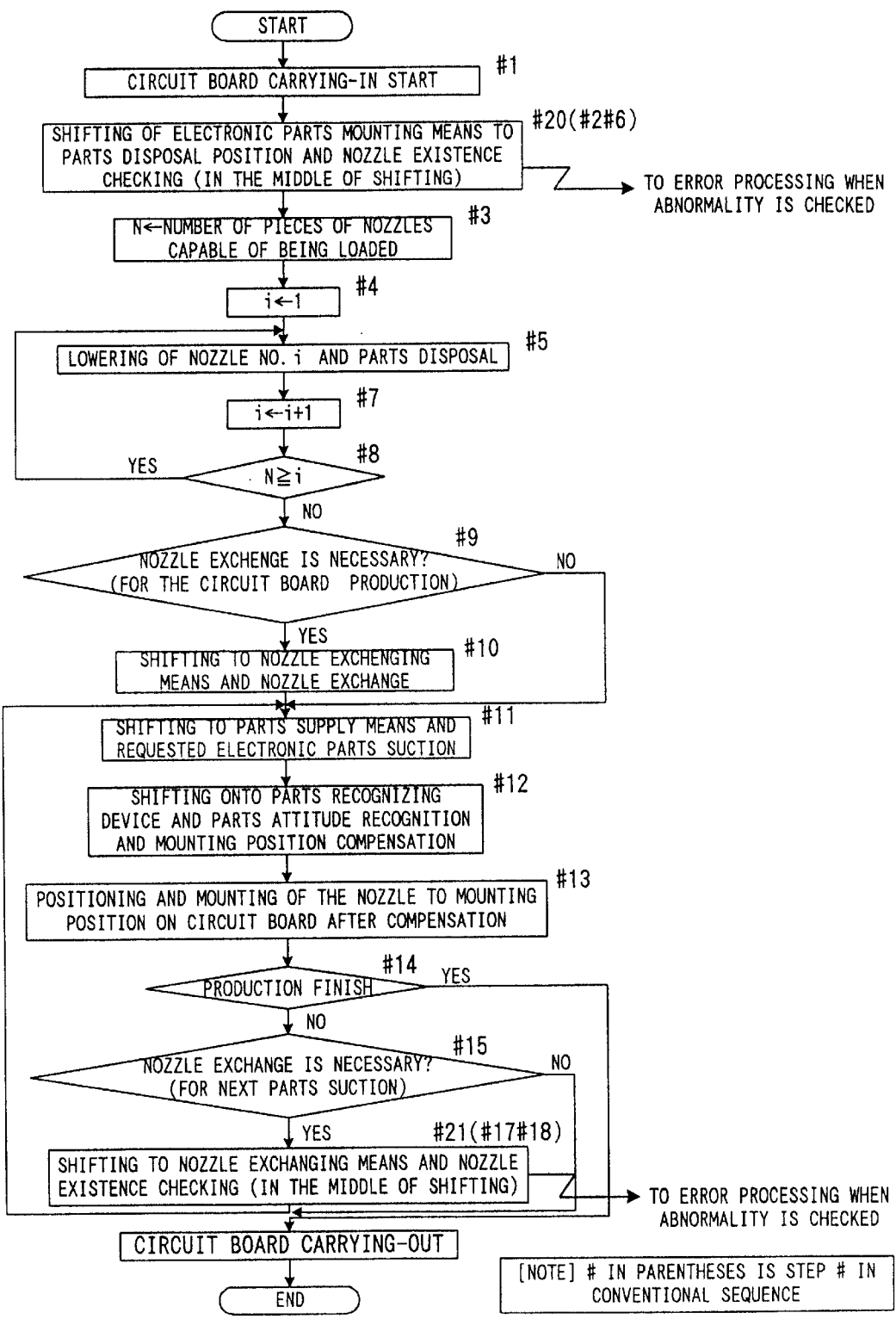
FIG. 1 is a drawing showing the control sequence of an electronic parts mounting method in one example of the present invention.

FIG. 1 is a figure showing the control sequence of the electronic parts mounting method of the present invention. Moreover, FIG. 2 is an overall rough drawing of the electronic parts mounter for practicing the method of the present invention, and FIG. 3 is a partial detailed drawing of the electronic parts mounter.

Figure 2:
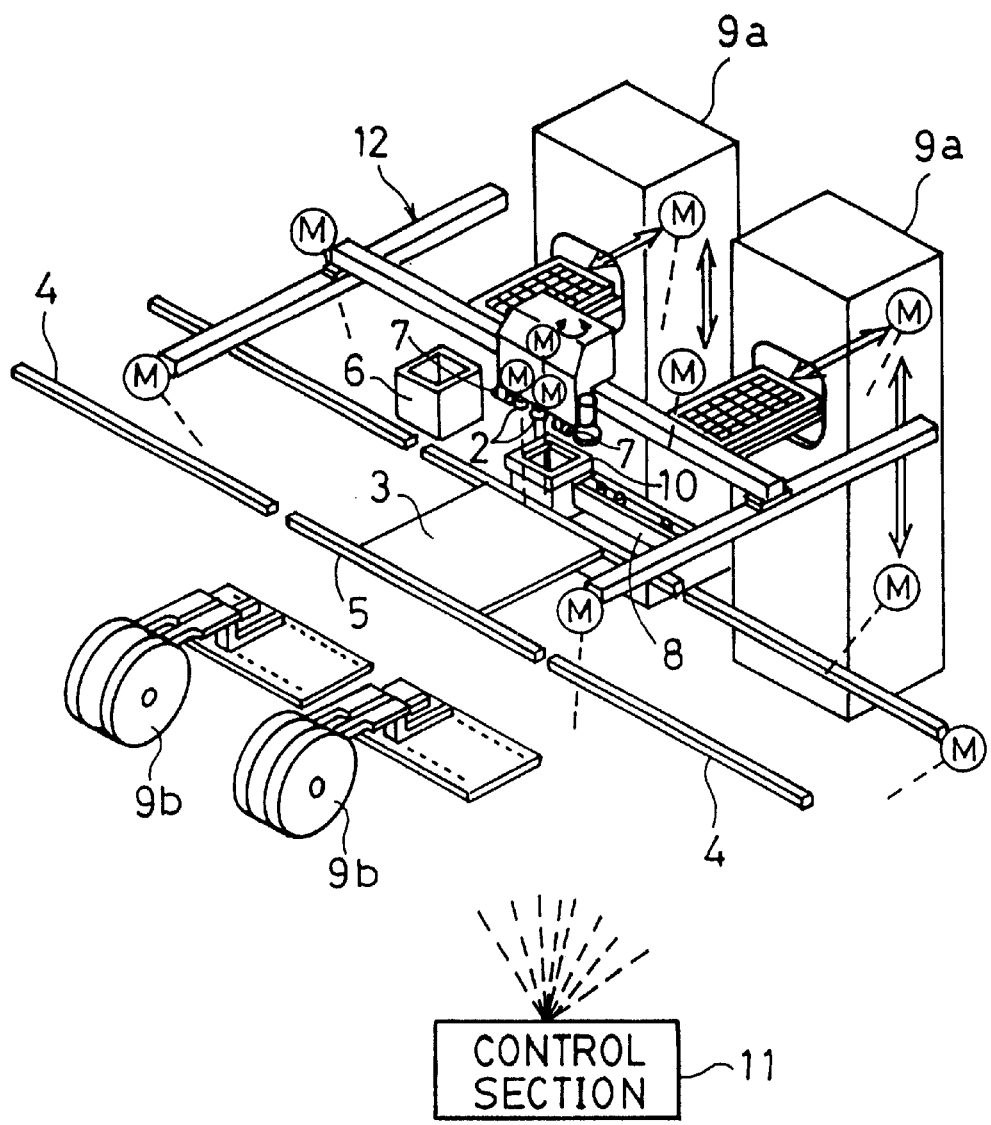
FIG. 2 is an overall rough drawing of an electronic parts mounter in one example of the present invention.
Figure 3:
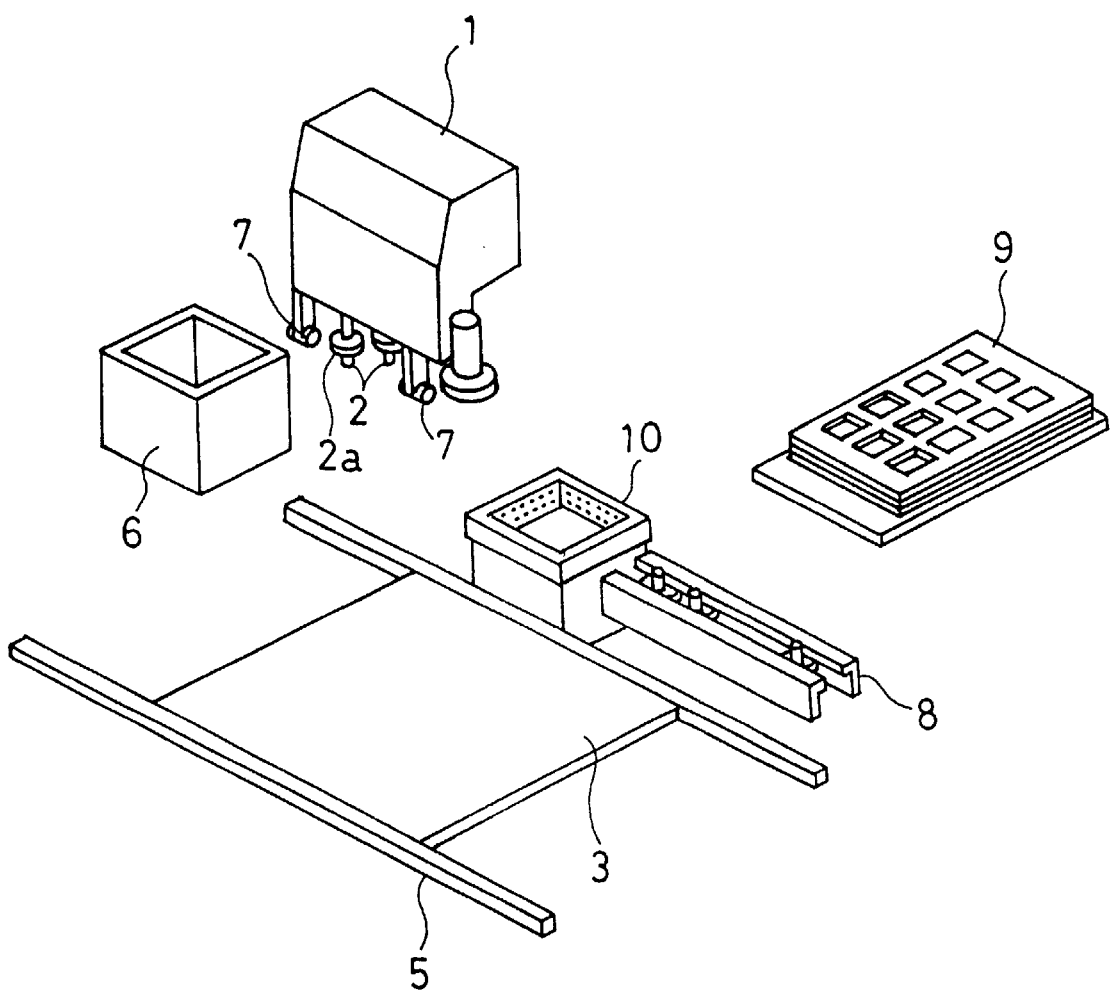
FIG. 3 is a partial detailed drawing of the electronic parts mounter in one example of the present invention.
Figure 11:
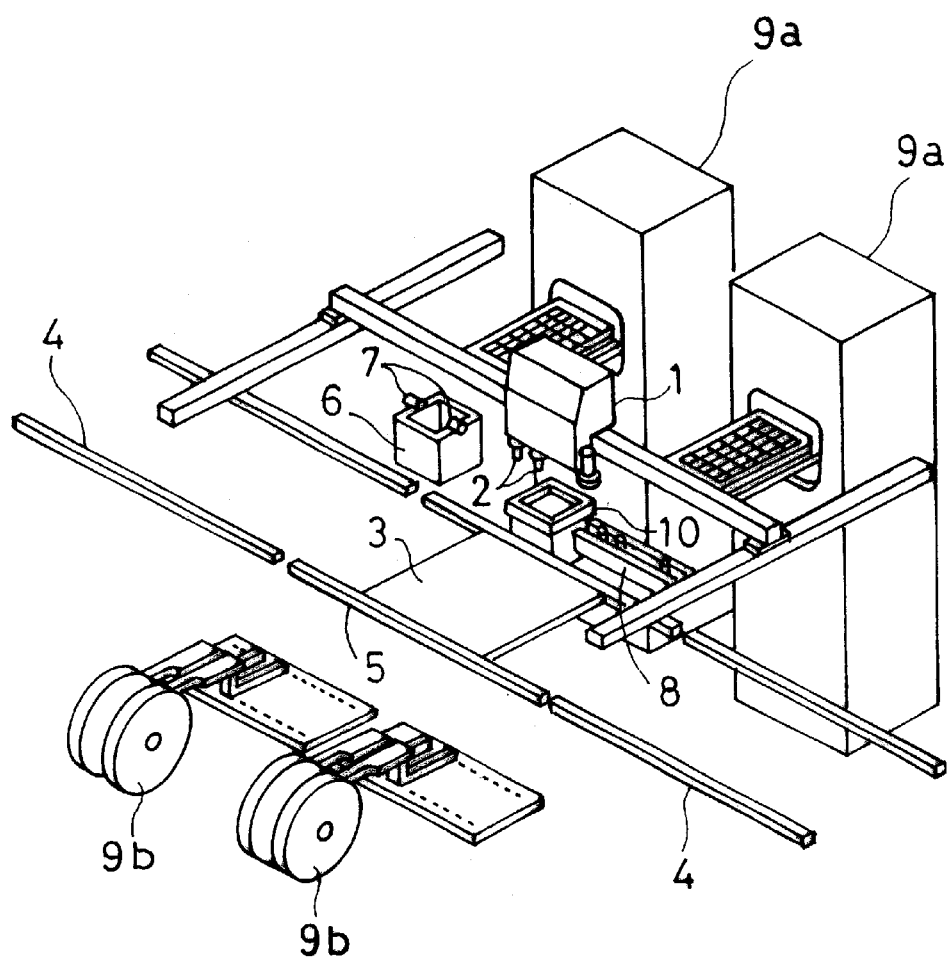
FIG. 11 is an overall rough drawing of an electronic parts mounter of a conventional example.
Figure 12:
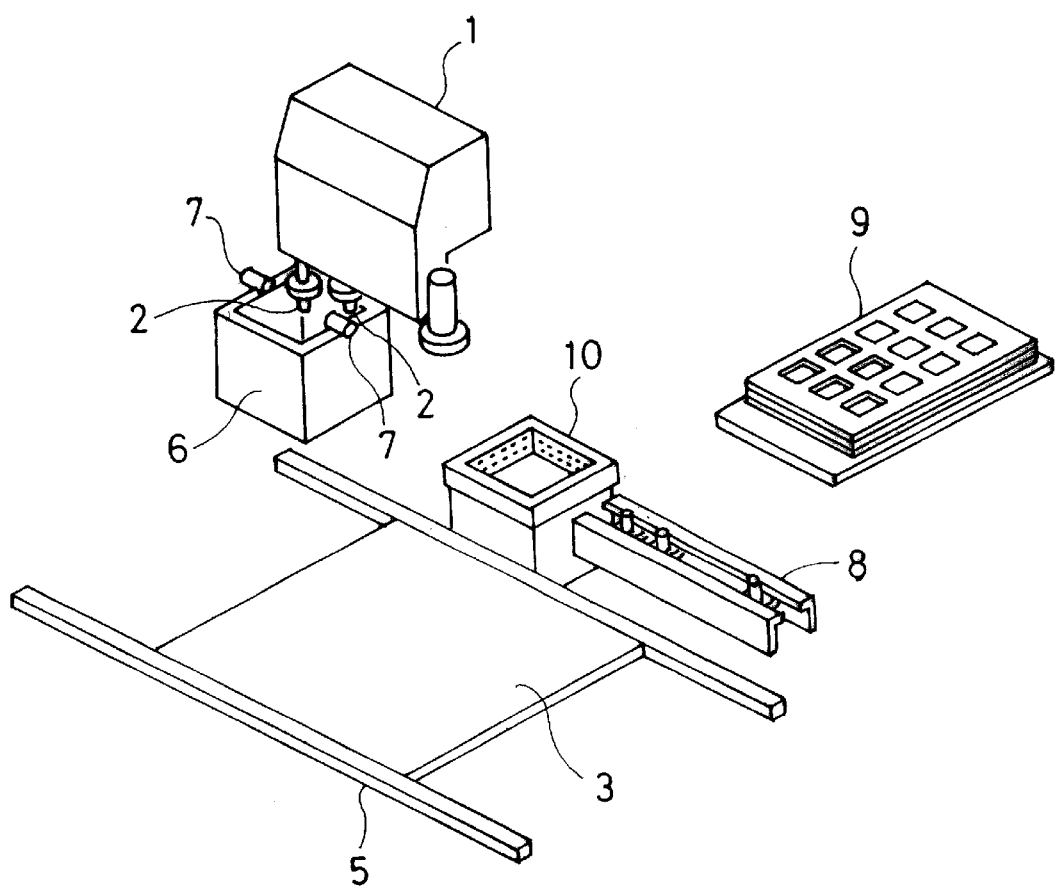
FIG. 12 is a partial detailed drawing of the electronic parts mounter of the conventional example.

In FIG. 2 and FIG. 3, the same numerals are given to the parts with the same name as in FIG. 11 and FIG. 12. That is, 1 is electronic parts mounting means (installation head), 2 is a suction nozzle (holding member), 3 is a circuit board (body to be equipped), 4 is a board carrying section, 5 is circuit board supporting means, 6 is a parts disposal box, 8 is nozzle exchanging means (tool change section), 9 is parts supply means, and 10 is a parts recognizing device such as a CCD camera. Part of terms in parentheses are terms corresponding to claims.

FIG. 2 and FIG. 3 are drawings corresponding to FIG. 11 and FIG. 12 of the prior art, and the present invention is different in that the nozzle existence checking sensors 7 (member detectors) are not installed at the parts disposal box 6 but they are installed on both sides of the suction nozzles 2 of the electronic parts mounting means 1.

Figure 4:
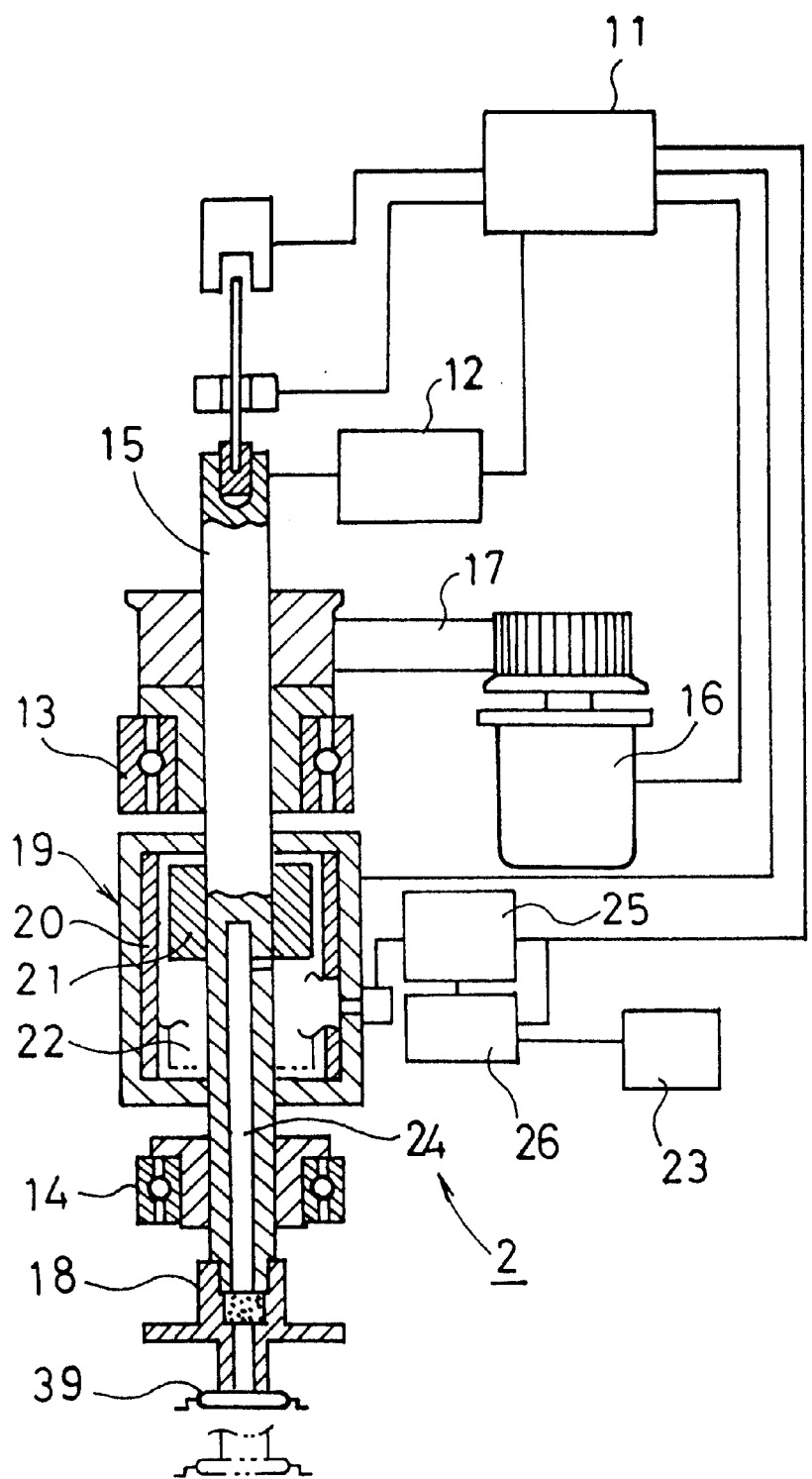
FIG. 4 is a sectional view of a suction nozzle.

FIG. 4 is a sectional view of the suction nozzle 2. This suction nozzle 2 is attached to the electronic parts mounting means 1 through the upper and lower bearings 13, 14 in such a way that it can rotate around the vertical axis of a spline shaft 15 and it can vertically slide. The spline shaft 15 is rotated by a motor 16 through a belt 17, and it can change the attitude of a part sucked and held by a nozzle 18 at the tip. At the approximately central portion of the spline shaft 15, a voice coil motor 19 is attached. This voice coil motor 19 vertically moves a magnet 21 by exciting a voice coil 20, and it vertically moves the spline shaft 15 fastened to the magnet 21. Consequently, the nozzle 18 vertically moves, so that parts can be mounted on the circuit board 3.

Moreover, at the suction nozzle 2, a vacuum sensor 25 is attached, and it senses the pressure of the suction device 23 such as a vacuum pump for a specified time (for example, 100 to 200 micro sec), and in a case of exceeding the threshold value, it can sense that a part is sucked and held by the suction nozzle 2. 26 denotes a suction shifting switch.

Figure 5:
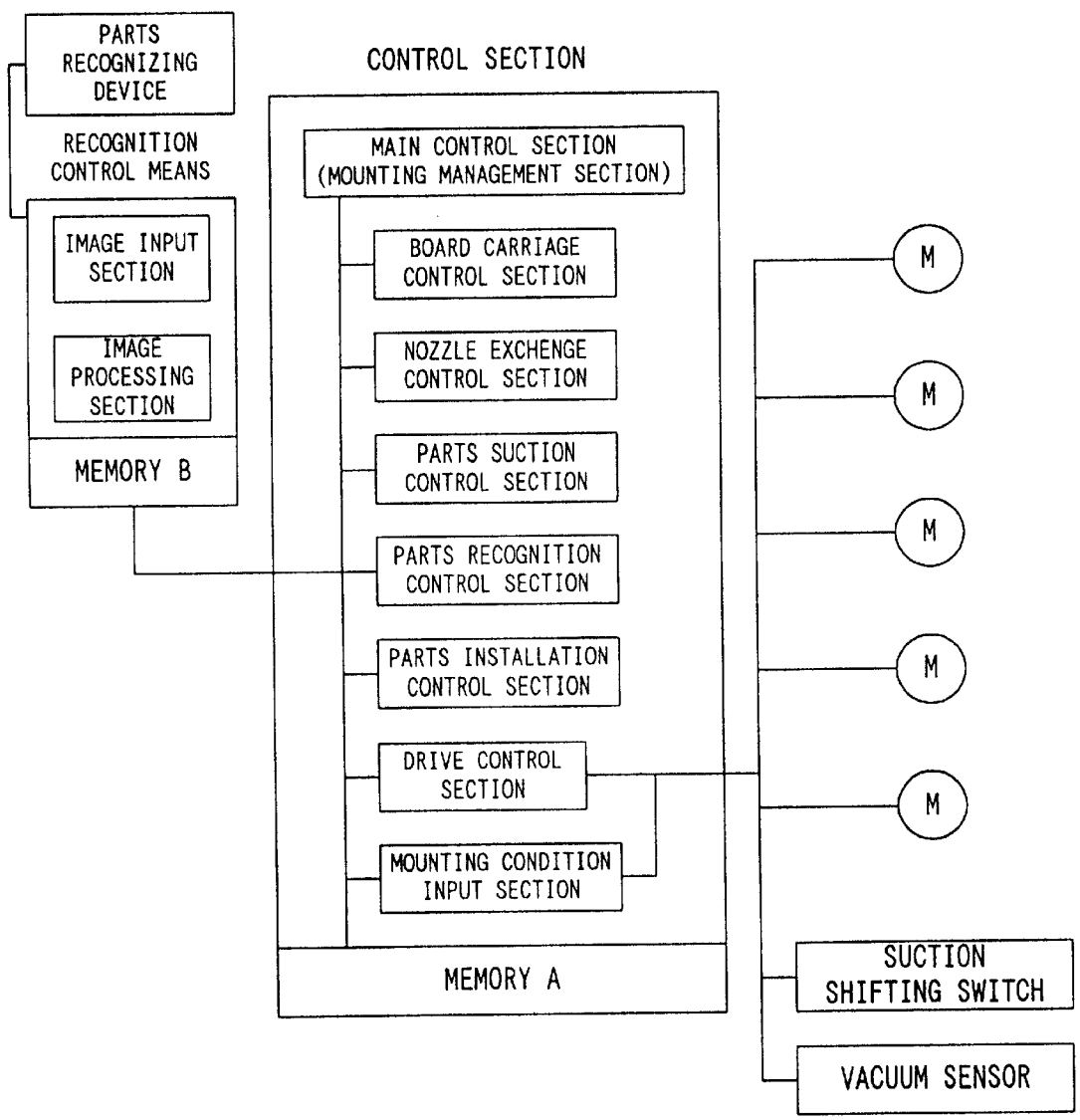
FIG. 5 is a block diagram of a control section in one example of the present invention.

11 denotes a control section, which controls an electronic parts mounter. As shown in FIG. 5, this control section 11 comprises a board carriage control section, a nozzle exchange control section, a parts suction control section, a parts recognition control section, a parts installation control section, a drive control section, a mounting condition input section, and a memory A. FIG. 6 shows the mounting data stored in the memory A, which stores a program to be practiced in the control section 11 for mounting an electronic part on the circuit board 3. FIG. 7 shows the parts supply section data stored in said memory A, and FIG. 8 shows the nozzle data. However, these data show nothing but one example.

Said drive control section controls a motor in the electronic parts mounting means 1, an XY robot 12, the board carrying section 4, a driving source M of a motor of the parts supply means 9, a suction switch 26, or the like.

Said board carriage control section gives a movement directive to the drive control section, and it drives the board carrying section 4, and it performs carrying-in and carrying-out of the board 3.

Said nozzle exchange control section reads in the parts supply position on the parts supply means 9 from the mounting data in FIG. 6, and on the basis of that, it reads in the used nozzle at the parts supply position of the parts supply section data in FIG. 7. In the memory A, it stores the previously used nozzle data, and it compares with the used nozzles obtained from said mounting data and the parts supply section data, and when the requested suction nozzle 2 on the mounting data is not loaded at the used head, it performs nozzle exchange. Moreover, it compares the value of the output result of the vacuum sensor with the previously given pressure value, and when the threshold value is exceeded, it detects existence of a part.

Said parts suction control section reads in the mounting data in FIG. 6, and it outputs a movement directive to the drive control section, and it drives the XY robot 12 to move the electronic parts mounting means 1 to the parts supply position of the parts supply means 9, and it drives the motor of the electronic parts mounting means 1 and the suction shifting switch 26 to perform the suction of a part.

Said parts recognition control section outputs a movement directive to the drive control section, and it moves the electronic parts mounting means 1 to the parts recognizing device 10, and the recognition control means in FIG. 5 inputs an image from the parts recognizing device into an image input section, and an image processing section processes the signal to recognize the attitude of the part.

Said parts installation control section outputs a movement directive to the drive control section according to the installation position and the installation angle in the mounting data, on the basis of the recognized result of the recognition control means, and it drives the XY robot 12 and the suction nozzle 2 to compensate the position of the part, and it moves the electronic parts mounting means 1 to the installation position on the circuit board 3 to mount the electronic part.

The mounting condition input section inputs the vacuum value detected from the vacuum sensor, or it inputs the positional information of XYZ from an encoder attached to each motor.

Each of the board carriage control section, the nozzle exchange control section, the parts suction control section, the parts recognition control section, and the parts installation control section has a judging section, which compares the input information data from the parts mounting input section with the data from the memory A, and controls the drive control section.

Figure 9:
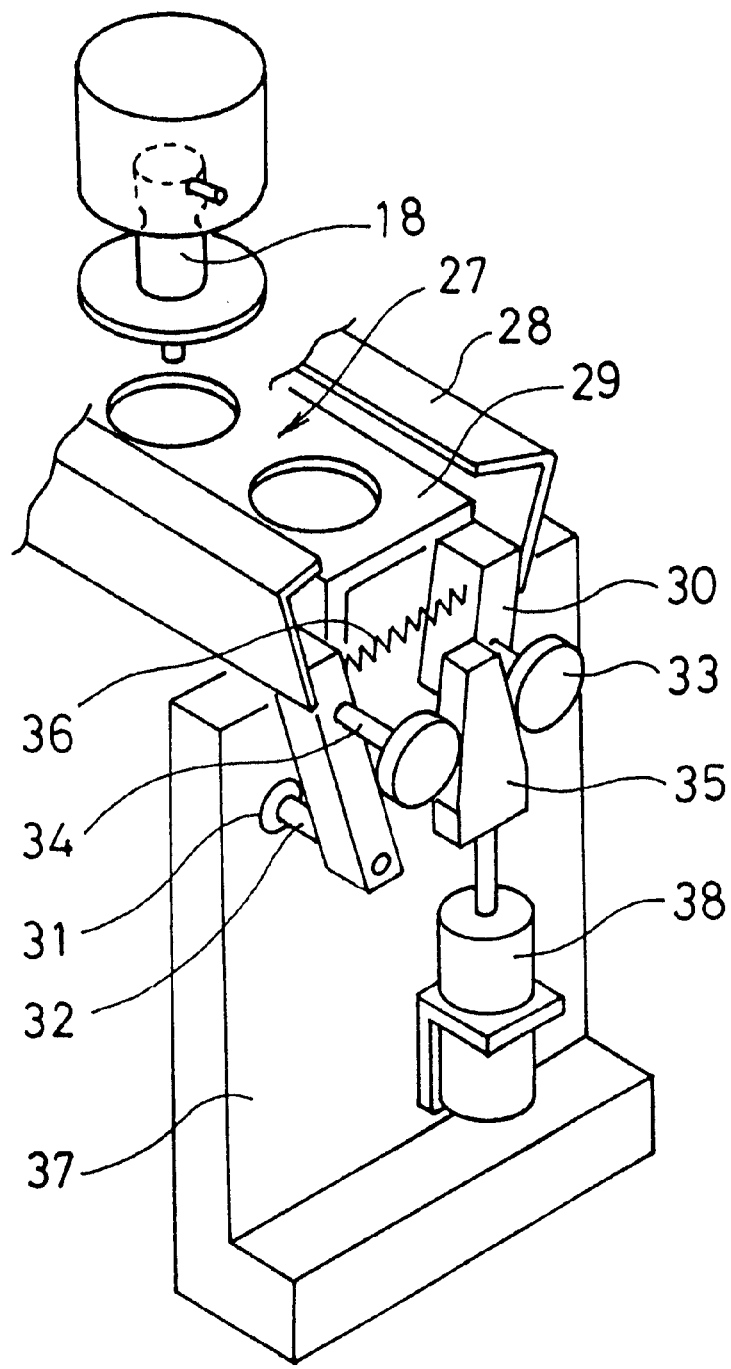
FIG. 9 is a partial perspective view of a nozzle exchanging means.
Figure 10:
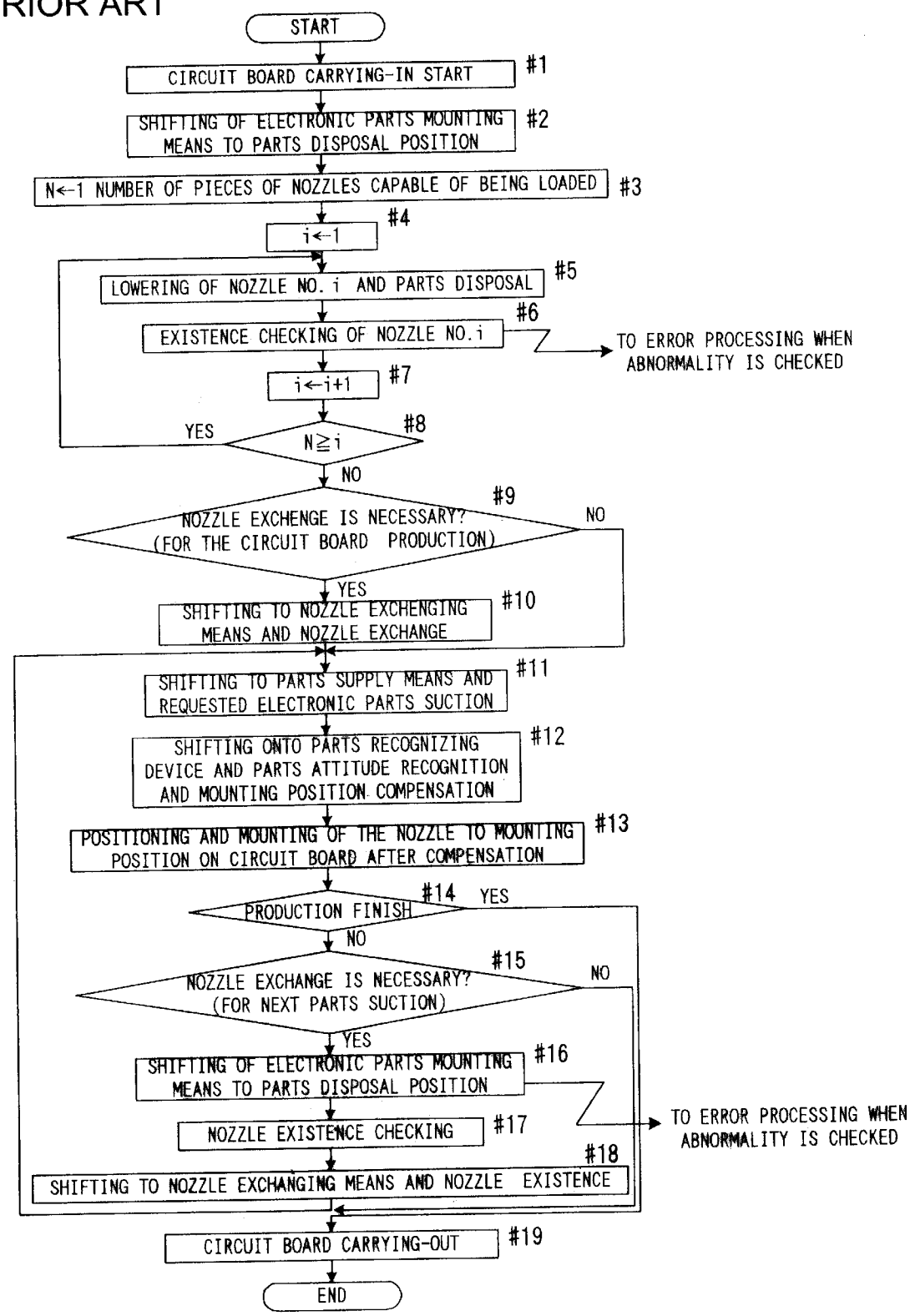
FIG. 10 is a drawing showing the control sequence of an electronic parts mounting method of a conventional example.

FIG. 9 is a partial perspective view of the nozzle exchanging means 8. The storing mechanism of this nozzle exchanging means 8 is storable in such a way that a plurality of kinds of nozzles 18 suitable for shapes and sizes of various types of electronic parts are mounted on a base plate 29 of a tool station 27 and they are fixedly held between the opening and closing levers 28. The opening and closing lever 28 is fixed at the tip of a block 30, and the support end of the block 30 is fixed at the tip of a shaft 32 which is rotatably supported by a bearing 31. At a portion on the tip side of the block 30, a shaft 34 having a rotary roller 33 attached is fixed. A vertically moving tapered side cam 35 comes into contact with the rotary roller 33, and at a portion on the tip side of the block 30, a spring 36 is attached to elastically urge the opening and closing levers 28 in the closing direction. The side cam 35 fixed to a bracket 37 is to be driven in the vertical direction by a cylinder 38.

Storing of the nozzle 18 is performed in such a way that the side cam 35 is made to be in the lowered state and the opening and closing levers 28 are closed through the block 30 by the urging force of the spring 36 and the nozzle 18 is held between the base plate 29 and the opening and closing levers 28. When exchanging a nozzle, the cylinder 38 pushes up the side cam 35. At that moment, the rotary roller 33 moves to the right and left along the tapered surface of the side cam 35, and the side cam 35 opens the blocks 30 against the urging force of the spring 36. Since the blocks 30 are opened, the opening and closing levers 28 are opened, and the nozzle 18 is made to be in an exchangeable state.

Next, the operation of said electronic parts mounter will be described. First, similarly to the prior art, a circuit board 3 to be produced is carried into the circuit board supporting means 5 from the board carrying section 4 (step #1).

The step of exchanging the nozzle 18 is performed as follows: First, the nozzle exchange control section compares the vacuum value detected from the vacuum sensor 25 with the previously set vacuum value to be the threshold value, and depending on the result, it judges whether a part is left in the installed state or not. This threshold value (when the vacuum value exceeds this threshold value, it is judged that a part is installed) has previously been set for each nozzle 18, and the state of a nozzle previously used is read out from the memory A, and the vacuum value which is the threshold value of this nozzle 18 is compared with the detected value from the vacuum sensor 25. Moreover, it is also suitable to set this threshold value in advance for each part. Or, it is also suitable for an operator to set the value in advance arbitrarily.

Then, when it is judged that a part exists, the electronic parts mounting means 1 is shifted to the parts disposal box 6 by the XY robot 12 for the parts disposal operation. In the middle of the shifting, the nozzle existence checking sensor 7 detects the present existence condition of the nozzle 18 (step #20). This detecting operation is performed as follows: The collars 2a (of course, the parts are not limited to collars) of all nozzles 18 are raised to the positions where the optical path of the nozzle existence checking sensor 7 is not interrupted (sensing positions), and by vertically moving (here, by approximately 2 mm) the suction nozzles 2 one by one in turn, it is detected whether a collar 2a interrupts the optical path of the nozzle existence checking sensor 7 or not. Then, while the nozzle existence checking sensor 7 is detecting the nozzle existence condition, the drive control section of the control section 11 operates the XY robot 12 to shift the electronic parts mounting means 1 to the position of the parts disposal box 6, and it performs the parts disposal operation (step #5).

Checking of the kind of the suction nozzle 2 is performed as follows: The nozzle exchange control section of the control section 11 reads out the data such as the installation position of the circuit board, the installation angle, the parts supply position in the parts supply means, and the used head, in the order of mounting, from the mounting data in FIG. 6 stored in the memory A of the control section 11. Then, on the basis of the information of the parts sucking position of the mounting data, it reads out the data such as the used nozzle, the parts name, the degree of vacuum to be the threshold value from the parts supply section data in FIG. 7. Furthermore, on the basis of the used nozzle read out from FIG. 7, it reads out the nozzle setting position in the nozzle exchanging means in FIG. 8. Then, on the basis of the read out data, it checks the kind of the suction nozzle 2. At this moment, in a case of reading in the same used head from the mounting data, it stops the data input, and shifts to the next mounting operation. That is, in a case where the data of the head in use comes in, it shifts to the next operation so that the head may not interfere.

Next, the used nozzle in this mounting order is compared with the last used nozzle previously stored in the memory A, and when it is judged that the nozzle exchange is needed (step #9), the electronic parts mounting means 1 is shifted onto the nozzle exchanging means 8 by the XY robot 12 for loading the necessary suction nozzle 2 to the electronic parts mounting means 1. In the nozzle exchanging means 8, the necessary suction nozzle 2 is loaded to the electronic parts mounting means 1 (step #10).

If it is judged that no part exists at the suction nozzle 2, it is suitable to start from the above disposal operation for safety, but it is also suitable to start from the step of judging the suction nozzle exchange as it is.

Usually, in the nozzle exchange, the suction nozzles 2 are loaded one by one to the electronic parts mounting means 1 from the nozzle exchanging means 8 where a plurality of suction nozzles 2 are arranged in a line. However, in a case where a plurality of suction nozzles 2 are arranged at the nozzle exchanging means 8 in the order in which they are wanted to be loaded to the electronic parts mounting means 1, it is also possible that the electronic parts mounting means 1 is raised and lowered on the nozzle exchanging means 8 to perform the loading of the nozzles at one time. Moreover, in a case where the combination of suction nozzles is determined in advance for each different kind of board, it is also possible that a plurality of nozzles 2 are intentionally arranged in the specified order to load the nozzles to the electronic parts mounting means 1 at one time. When the nozzle exchange is performed in this manner, the nozzle loading time can be made considerably shorter than that in the prior art. Furthermore, even in a case where the kind of the circuit board is changed, the nozzle exchange can be performed at once, and even in a case where the object of production is changed, no loss arises in the production time, and the productivity is improved.

After that, according to the mounting data in FIG. 6, the parts suction control section of the control section 11 outputs a movement directive to the drive control section, and it drives the XY robot 12, the motor M, and the suction shifting switch 26 to shift the electronic parts mounting means 1 to a specified position of the parts supply means 9, and to make the suction nozzle 2 of the electronic parts mounting means 1 suck and hold a requested electronic part (step #11).

After that, the parts recognition control section of the control section 11 outputs a movement directive to the drive control section and the recognition control means to shift the electronic part onto the parts recognizing device 10, and the attitude of the sucked and held electronic part is imaged at the parts recognizing device 10, and on the basis of this imaged result, the image of the electronic part is processed in the image input section and the image processing section of the recognition control means in FIG. 5, and the attitude of the electronic part is recognized.

Then, on the basis of the above recognized data, the parts installation control section drives the suction nozzle 2 and the XY robot to compensate the mounting position (step #12), and it outputs a movement directive to the drive control section according to the mounting data to shift the electronic parts mounting means 1 onto a specified circuit board, and by rotating the suction nozzle 2 through a specified angle, the electronic part is mounted to the mounting position on the circuit board 3 (step #13). Here, the part is mounted on the circuit board according to the mounting position X and the mounting angle e on the circuit board from the mounting data in FIG. 6.

At this moment, it is checked whether the production of the circuit board 3 has finished or not (step #14), and when the production has finished, the circuit board 3 is carried out of the circuit board supporting means 5 (step #19). When the production has not finished, the suction processing (steps #15, #21, #11 to #13) of the next electronic part is performed. At this moment, it is checked whether a suction nozzle 2 necessary for the mounting of the next electronic part is loaded to the electronic parts mounting means 1 or not (step #15). When such a nozzle 2 is not loaded, the electronic parts mounting means 1 shifts to the nozzle exchanging means 8 for performing nozzle exchange, and in the middle of the shifting, the nozzle existence checking is performed by the nozzle existence checking sensor 7 installed at the electronic parts mounting means 1 (step #21).

As mentioned above, according to the present invention, the nozzle existence checking sensor 7 is installed at the electronic parts mounting means 1, and consequently, in the middle of performing any processing such as parts disposal operation or nozzle exchange, the existence checking of the suction nozzle 2 can be performed, and it is unnecessary to shift onto the parts disposal box 6 for checking the existence of the suction nozzle 2, and wasteful operation and time can be avoided, and productivity can be improved.

Moreover, the parts disposal operation and nozzle exchange can be performed faster, and consequently, it is possible to comply with the reduction of the board carrying time by making the board carrying speed higher, and the increase of the number of pieces of suction nozzles loaded to the electronic parts mounting means for decreasing the number of times of nozzle exchange, and more improvement in productivity can be expected.

What is claimed is:

1. A parts installation method for installing a part to a body, the part being held by a holding member for attaching to and detaching from a parts mounter according to the part to be held, comprising:

shifting a holding member;

determining, during said shifting, whether to exchange the holding member with a replacement holding member; and exchanging, according to said determination, the holding member with a replacement holding member stored in a tool change section, the replacement holding member corresponding to a part to be held.

2. A parts installation method for installing a part to a body, the part being held by a suction nozzle for attaching to and detaching from a parts mounter according to the part to be held, comprising:

shifting a holding member;

determining, during said shifting, whether to exchange the suction nozzle with a replacement suction nozzle; and exchanging, according to said determination, the suction nozzle with a replacement suction nozzle stored in a tool change section, the replacement suction nozzle corresponding to a part to be held by suction.

3. A parts mounting method, comprising:

shifting a parts mounting means equipped with a nozzle existence checking sensor located on each of two sides of a suction nozzle, the suction nozzle for attaching to and detaching from a parts mounter, and for moving vertically;

detecting, during shifting, with said nozzle existence checking sensor, existence of a suction nozzle moving vertically at least one suction near a nozzle loaded to said parts mounting means.

4. A parts mounting method for mounting a part to a body, the part being held by a suction nozzle while a parts mounting means equipped with a nozzle existence checking sensor is shifted, comprising:

positioning a plurality of suction nozzles loaded to said parts mounting means at a sensing position of said nozzle existence checking sensor, while shifting the parts mounting means equipped with the nozzle existence checking sensor;

raising and lowering said suction nozzles and detecting with said existence checking sensor existence of a suction nozzle positioned at the sensing position; and performing said positioning a plurality of suction nozzles and raising and lowering said suction nozzles for a plurality of loaded specified suction nozzles in turn.

5. The parts mounting method according to claim 4, wherein the nozzle existence checking sensor is a photo sensor, and said raising and lowering shields an optical path of said photo sensor for checking existence of the nozzle.

6. The parts mounting method according to claim 4, wherein detecting existence of a suction nozzle is performed by the nozzle existence checking sensor while the parts mounting means is shifting to a parts disposal position.

7. The electronic parts mounting method according to claim 4, wherein detecting existence of a suction nozzle is performed by the nozzle existence checking sensor, while the parts mounting means is shifting to a nozzle exchanging means.

8. A parts installation device comprising:

an installation head including a holding member for moving vertically and for freely attaching and detaching said holding member from said installation head according to a part to be held; and a tool change section comprising a replacement holding member for attachment to said installation head and in which said holding member is exchanged with said replacement holding member by said installation head, wherein said installation head includes a member detector for detecting existence of vertical-direction movement of said replacement holding member in said tool change section.

9. A parts mounter comprising:

parts supply means including a unit for supplying a part;

circuit board supporting means for fastening a circuit board when mounting a part;

parts mounting means including a mechanism loaded with a suction nozzle and adapted for vertically moving said suction nozzle when holding a part by suction, and for positioning said suction nozzle at any position; and nozzle exchanging means including a mechanism for removing and installing a requested suction nozzle from and to said parts mounting means, wherein said parts mounting means further comprises a nozzle existence checking sensor for performing detection of conditions of a suction nozzle loaded to said parts mounting means.

10. The parts mounter according to claim 9, wherein a vacuum sensor is attached for sensing pressure of suction means of the suction nozzle.

* * * * *